(12) United States Patent
Park et al.

(10) Patent No.: US 9,231,040 B2
(45) Date of Patent: Jan. 5, 2016

(54) ORGANIC LIGHT EMITTING DIODE DISPLAY

(75) Inventors: Kyong-Tae Park, Yongin (KR);
Keum-Nam Kim, Yongin (KR);
Sung-Jae Moon, Yongin (KR)

(73) Assignee: Samsung Display Co., Ltd.,
Samsung-ro, Giheung-Gu, Yongin-si,
Gyeonggi-Do (KR)

( * ) Notice: Subject to any disclaimer, the term of this patent is extended or adjusted under 35 U.S.C. 154(b) by 621 days.

(21) Appl. No.: 13/537,479

(22) Filed: Jun. 29, 2012

(65) Prior Publication Data

US 2013/0093654 A1    Apr. 18, 2013

(30) Foreign Application Priority Data

Oct. 17, 2011    (KR) .................. 10-2011-0105921

(51) Int. Cl.
*H01L 27/32*    (2006.01)
*G09G 3/32*    (2006.01)

(52) U.S. Cl.
CPC .......... *H01L 27/3276* (2013.01); *G09G 3/3233* (2013.01)

(58) Field of Classification Search
USPC ..................................... 345/72–86
See application file for complete search history.

(56) References Cited

U.S. PATENT DOCUMENTS

2008/0012474 A1 *    1/2008   Sung et al. ............... 313/504

FOREIGN PATENT DOCUMENTS

| KR | 10-2006-0059745 | 6/2006 |
| KR | 10-0658292 | 12/2006 |
| KR | 10-2011-0019498 | 2/2011 |

* cited by examiner

*Primary Examiner* — Robin Mishler
(74) *Attorney, Agent, or Firm* — Robert E. Bushnell, Esq.

(57) ABSTRACT

An organic light emitting diode (OLED) display according to the present invention includes: a pixel portion wherein an organic light emitting diode including a pixel electrode, an organic emission layer, and a common electrode is formed, and a periphery portion surrounding the pixel portion and having a plurality of common voltage lines applying a common voltage to the common electrode. The common voltage lines include a plurality of common voltage pads to which the common voltage is applied from an external source, a common voltage contact portion overlapping an end of the common electrode and contacting the common electrode, a common voltage connection portion connecting a common voltage pad and the common voltage contact portion. A width of the common voltage contact portion is larger than that of the common voltage connection portion.

18 Claims, 13 Drawing Sheets

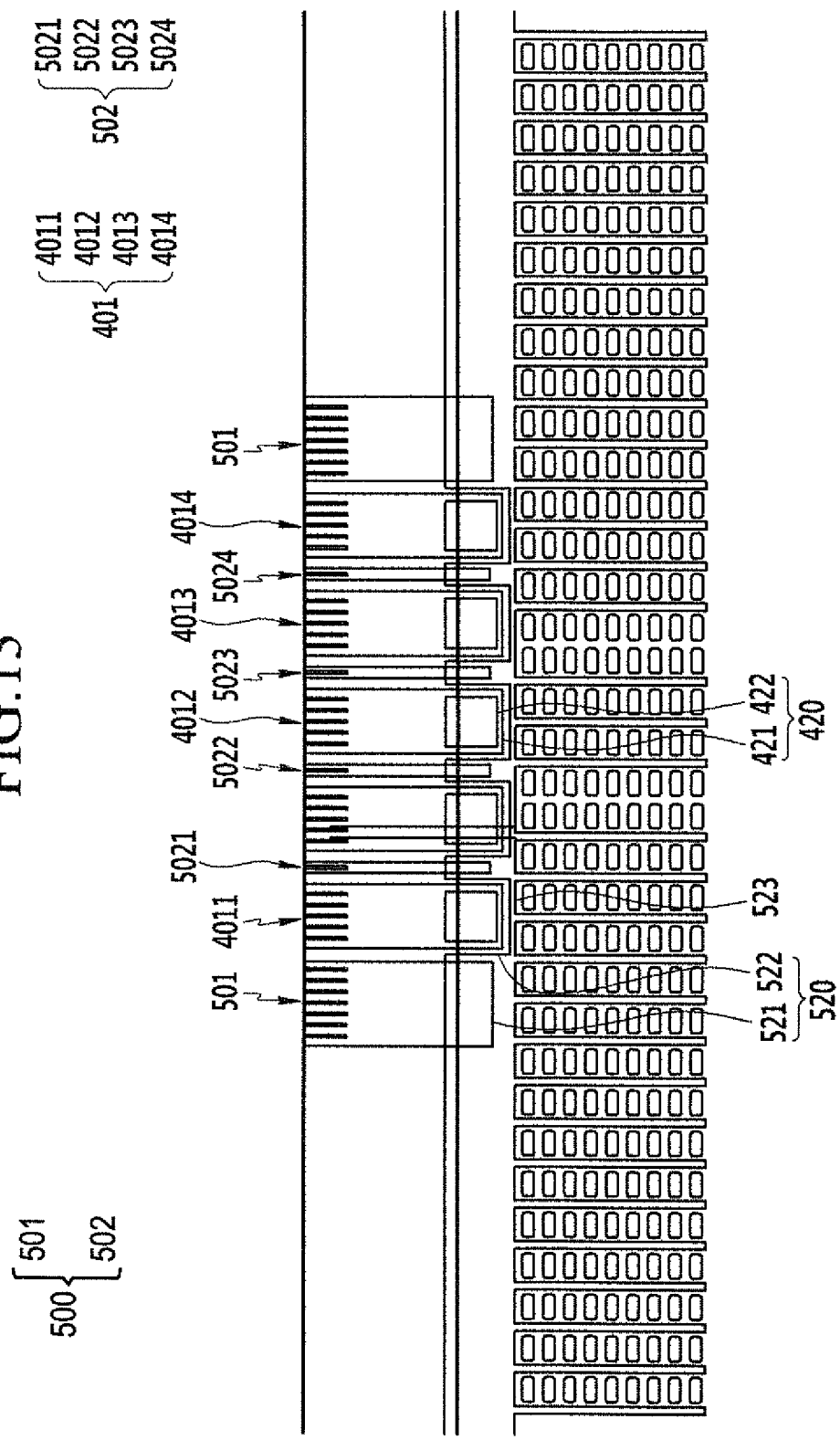

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 17$^{th}$ of Oct. 2011 and there duly assigned Serial No. 10-2011-0105921.

BACKGROUND OF THE INVENTION

1. Field of the Invention

The present invention relates to an organic light emitting diode (OLED) display. More particularly, the present invention relates to an OLED which can maximize a contact area of a common voltage contact portion of a common voltage line and minimize a voltage drop of a driving voltage line while reducing a dead space.

2. Description of the Related Art

An organic light emitting diode (OLED) display includes two electrodes and an organic emission layer disposed between the two electrodes, and electrons injected from one electrode and holes injected from the other electrode are combined in the organic emission layer such that excitons are formed, and light is emitted by energy generated from the excitons.

The OLED display has self-luminance characteristics, and unlike a liquid crystal display (LCD), the thickness and weight thereof can be reduced since a separate light source is not required. Furthermore, since the organic light emitting diode display has high quality characteristics such as lower power consumption, high luminance, and short response time, it has been spotlighted as a next generation display device.

A unit pixel of such an OLED display includes a switching transistor, a driving transistor, a capacitor, and an organic light emitting diode (OLED), and the driving transistor and the capacitor are provided with a driving voltage Vdd from a driving voltage line, and the driving voltage line controls a current flowing to the organic light emitting diode through the driving transistor. In addition, a common voltage line connected to a cathode supplies a common voltage Vss to the cathode so as to make a current flow by forming a voltage potential difference between a source and drain and the cathode.

The driving voltage line and the common voltage line receive a driving voltage and a common voltage, respectively, from an external source through a driving voltage pad and a common voltage pad, respectively, formed in a periphery portion formed at the periphery region of a pixel portion where a plurality of pixels are formed. However, as the area of the driving voltage line and the common voltage line is increased in the periphery portion, the area of the pixel portion is reduced, and the area of the driving voltage line and the common voltage line mostly become a dead space where no pixel portion is formed, and thus no image can be displayed.

When the width of the common voltage line is reduced in order to reduce the dead space, the contact area of the common voltage contact portion is reduced so that current density is increased, thereby causing a heat generation problem.

Furthermore, when the width of the driving voltage line is reduced to reduce the dead space, the current density and luminance non-uniformity drop (IR DROP) due to a severe voltage.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention has been developed in an effort to provide an organic light emitting diode (OLED) display that can maximize a contact area of a common voltage contact portion of a common voltage line and minimize a voltage drop of a driving voltage line while reducing a dead space.

An OLED display according to an exemplary embodiment of the present invention includes a pixel portion where an organic light emitting diode including a pixel electrode, an organic emission layer, and a common electrode is formed and a periphery portion surrounding the pixel portion and having a plurality of common voltage lines applying a common voltage to the common electrode. The common voltage line includes a plurality of common voltage pads to which the common voltage is applied from an external source, a common voltage contact portion overlapping an end of the common electrode and contacting the common electrode, and a common voltage contact portion overlapping an end of the common electrode and contacting the common electrode, wherein a width of the common voltage contact portion is larger than that of the common voltage connection portion.

An end of the common voltage contact portion may include a common oblique line portion.

The OLED display may include a pixel substrate where the pixel portion and the periphery portion are formed, and the common oblique portion may be formed oblique to an imaginary line disposed in parallel with an end of the pixel substrate when viewed from a top as a top plan view.

The common voltage contact portion may include a protrusion portion protruding toward a side thereof.

The periphery portion further includes a plurality of driving voltage lines applying a driving voltage to the pixel electrode, and the driving voltage line may include a plurality of driving voltage pads to which the driving voltage is applied from an external source, a driving voltage overlapping portion overlapping the common electrode, and a driving voltage connection portion connecting the driving voltage pad and the driving voltage overlapping portion, wherein an end of the driving voltage overlapping portion includes a driving oblique line facing a common oblique line portion of the common voltage contact portion.

The driving oblique line portion may be disposed between the common oblique line portion and the pixel portion.

A width of an oblique line inflow portion, in which the driving voltage is taken among the driving oblique line, may be larger than an oblique line outlet portion through which the driving voltage is discharged.

The common voltage connection portion and the driving voltage connection portion may be formed in the same layer where a gate line is formed.

The driving voltage overlapping portion may include a gate driving voltage overlapping portion formed in the same layer where the gate line is formed and extending from the driving voltage connection portion, and a data driving voltage overlapping portion formed in the same layer where a data line is formed and overlapping the gate driving voltage overlapping portion.

The common voltage contact portion may include a gate common voltage contact portion formed in the same layer where the gate line is formed and extending from the common voltage connection portion, and a data common voltage contact portion formed in the same layer where the data line is formed and contacting the common electrode.

The plurality of common voltage lines may include a plurality of main common voltage lines and a plurality of auxiliary common voltage lines, each having a width that is smaller than that of each of the main common voltage lines.

The plurality of driving voltage lines may include a plurality of main driving voltage lines and a plurality of auxiliary driving voltage lines, each having a width that is smaller than that of each of the main driving voltage lines.

The main driving voltage line may surround the side surface of the main common voltage line.

The auxiliary common voltage line may surround the side surface of the main driving voltage line.

The plurality of main common voltage lines may be connected with each other.

The plurality of main common voltage lines may be separated from each other.

An OLED display according to another exemplary embodiment of the present invention includes: a pixel portion where an organic light emitting diode including a pixel electrode, an organic emission layer, and a common electrode is formed; and a periphery portion surrounding the pixel portion, and having a plurality of common voltage lines applying a common voltage to the common electrode and a plurality of driving voltage lines applying the driving voltage to the pixel electrode. The plurality of driving voltage lines may include a plurality of main driving voltage lines surrounding a pair of common voltage lines and auxiliary driving voltage lines disposed between the pair of common voltage lines.

The main driving voltage lines and the auxiliary driving voltage lines may be connected to each other.

The common voltage lines may include a common voltage contact portion overlapping an end of the common electrode and contacting the common electrode, the driving voltage line may include a driving voltage overlapping portion connected to a pixel driving voltage line that is parallel with a data line and overlapping the common electrode, and the driving voltage overlapping portion of the main driving voltage line may include a driving extension portion facing the common voltage contact portion.

The driving extension portion may be connected to a driving voltage overlapping portion of the auxiliary driving voltage line.

The auxiliary driving voltage line may include a plurality of sub-auxiliary driving voltage lines.

The common voltage line may include a plurality of sub-common voltage lines disposed between the plurality of sub-auxiliary driving voltage lines.

According to the exemplary embodiments of the present invention, an end of the common voltage line has a common oblique portion so that a dead space can be reduced and a contact area of the common voltage contact portion of the common voltage line can be maximized.

Furthermore, an end of the driving voltage overlapping portion has a driving oblique line portion facing the common oblique line portion of the common voltage contact portion, and a width of an oblique line inflow portion, in which the driving voltage is taken among the driving oblique line, is set to be larger than an oblique line outlet portion through which the driving voltage is discharged, and accordingly a voltage drop of the driving voltage line can be minimized.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 13 is a top plan view of an OLED display according to a fifth exemplary embodiment of the present invention.

DETAILED DESCRIPTION OF THE INVENTION

Figure 1:
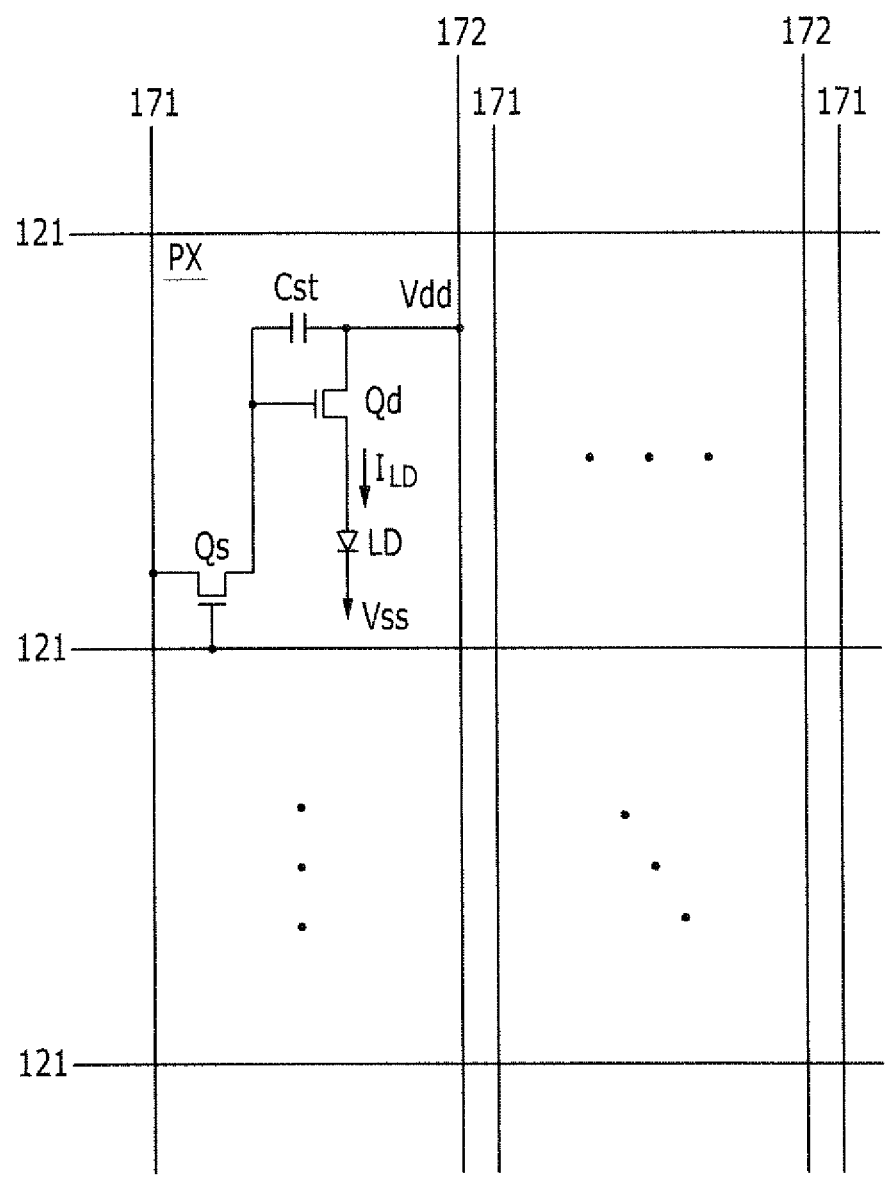
FIG. 1 is an equivalent circuit diagram of an organic light emitting diode (OLED) display according to a first exemplary embodiment of the present invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

In various exemplary embodiments, the same reference numerals are used for elements having the same configuration and will be representatively described in a first exemplary embodiment. In other exemplary embodiments, only elements different from those of the first exemplary embodiment will be described.

In order to clarify the present invention, parts which are not connected to the description will be omitted, and the same elements or equivalents are referred to by the same reference numerals throughout the specification.

In addition, the size and thickness of each component shown in the drawings are arbitrarily shown for understanding and ease of description, but the present invention is not limited thereto. Therefore, an exemplary embodiment is not restricted to the illustration. Furthermore, it will be understood that, when an element such as a layer, film, region or substrate is referred to as being "on" another element, it can be directly on the other element or intervening elements may also be present.

FIG. 1 is an equivalent circuit diagram of an organic light emitting diode (OLED) display according to a first exemplary embodiment of the present invention.

Referring to FIG. 1, an OLED display according to the present exemplary embodiment includes a plurality of signal lines 121, 171, and 172 and a plurality of pixels PX connected to the signal lines 121, 171, and 172 and arranged approximately in a matrix format.

The signal lines include a plurality of gate lines 121 transmitting a gate signal (or a scan signal), a plurality of data lines 171 transmitting a data signal, and a plurality of driving voltage lines 172 transmitting a driving voltage Vdd. The gate lines 121 are extended approximately in a row direction and almost parallel with each other, and the data lines 171 and the driving voltage lines 172 are approximately extended in a column direction and almost parallel with each other.

Each pixel includes a switching thin film transistor Qs, a driving thin film transistor Qd, a storage capacitor Cst, and an organic light emitting diode (OLED) LD.

The switching thin film transistor Qs includes a control terminal, an input terminal, and an output terminal. The control terminal is connected to the gate line 121, the input terminal is connected to the data line 171, and the output terminal is connected to the driving thin film transistor Qd. The switching thin film transistor Qs transmits the data signal applied to the data line 171 to the driving thin film transistor Qd in response to the scan signal applied the gate line 121.

The driving thin film transistor Qd also includes a control terminal, an input terminal, and an output terminal. The control terminal is connected to the switching thin film transistor Qs, the input terminal is connected to the driving voltage line 172, and the output terminal is connected to the OLED LD. The driving thin film transistor Qd flows an output current $I_{LD}$ that varies in its size according to a voltage applied between the control terminal and the output terminal.

The capacitor Cst is connected between the control terminal and the input terminal of the driving thin film transistor Qd. The capacitor Cst charges the data signal applied to the control terminal of the driving thin film transistor Qd, and maintains charging of the data signal after the switching thin film transistor Qs is turned off.

The OLED LD includes an anode connected to the output terminal of the driving thin film transistor Qd and a cathode connected to a common voltage Vss. The OLED LD displays an image by emitting light, the strength of which varies depending on the current $I_{LD}$ of the driving thin film transistor Qd.

The switching thin film transistor Qs and the driving thin film transistor Qd are n-channel field effect transistors (FETS). However, at least one of the switching thin film transistor Qs and the driving thin film transistor Qd may be a p-channel field effect transistor. In addition, the connection relationship between the thin film transistors Qs and Qd, the capacitor Cst, and the OLED LD may be changed.

The structure of the OLED display shown in FIG. 1 will be described in further detail with reference to FIG. 2 to FIG. 6.

Figure 2:
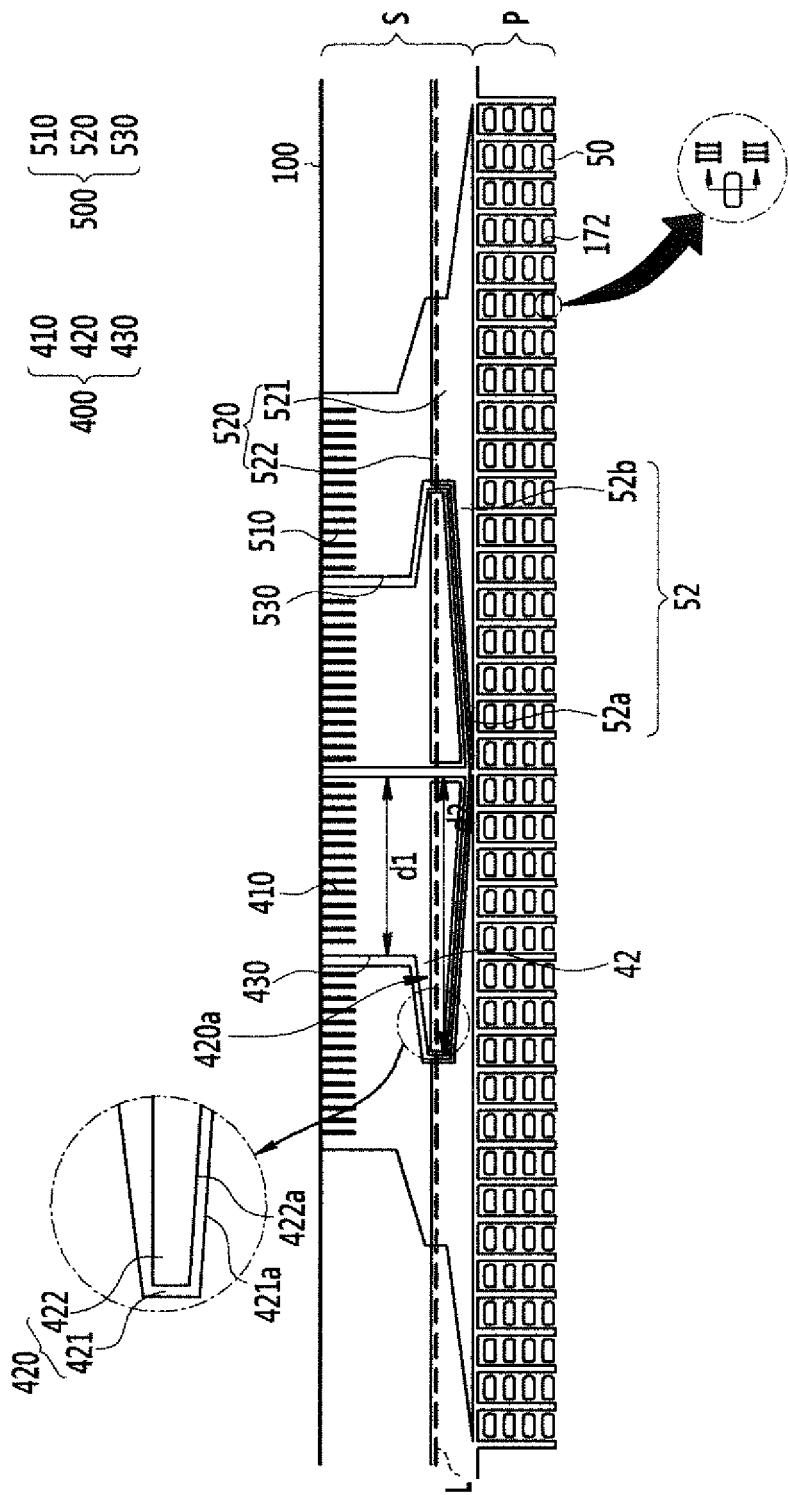
FIG. 2 is a top plan view of a pixel portion and a periphery portion of the OLED display according to the first exemplary embodiment of the present invention.
Figure 3:
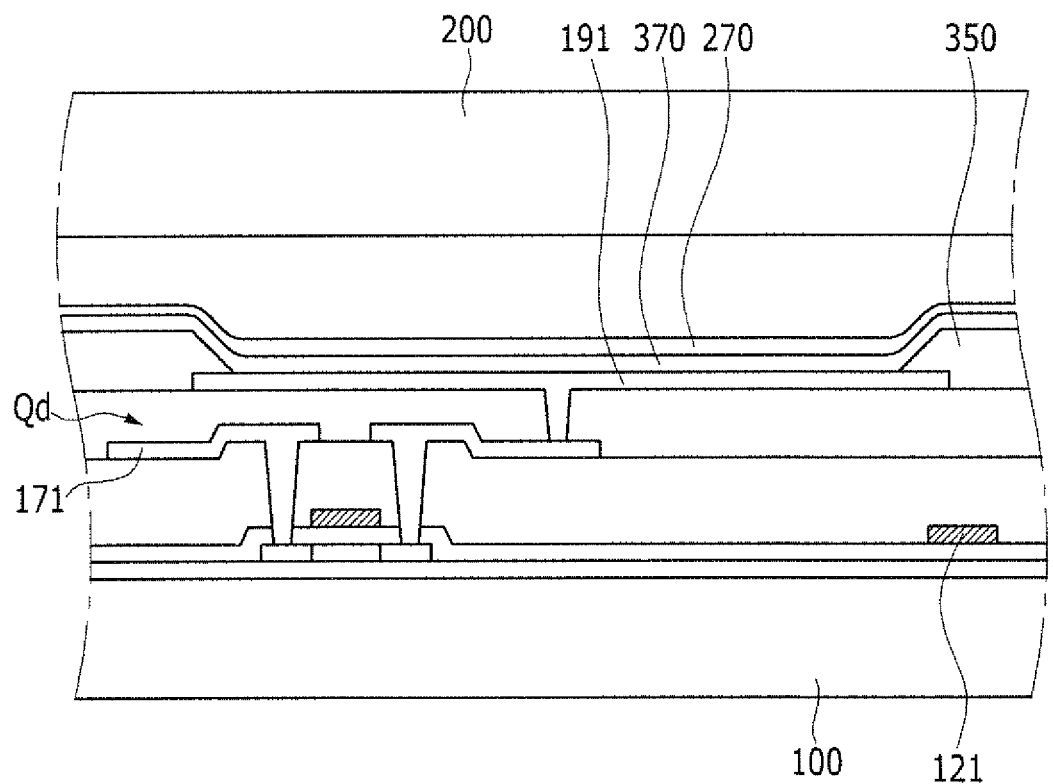
FIG. 3 is a cross-sectional view of the pixel portion of FIG. 2, taken along the line III-III.
Figure 4:
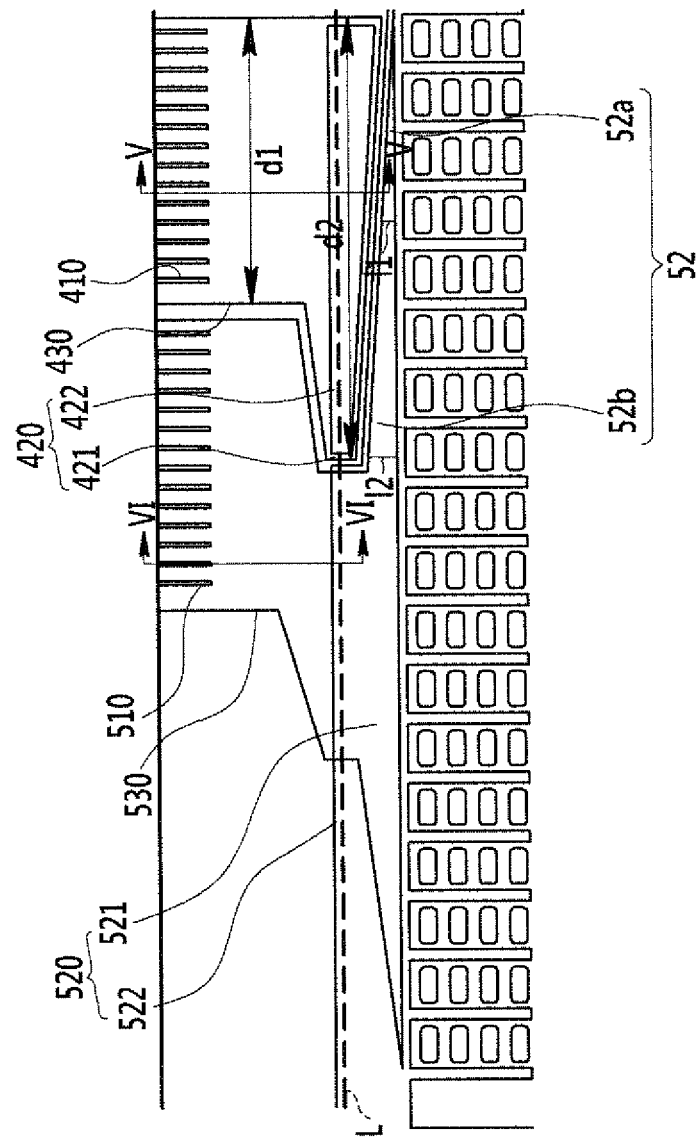
FIG. 4 is a partially enlarged top plan view of FIG. 2.
Figure 5:
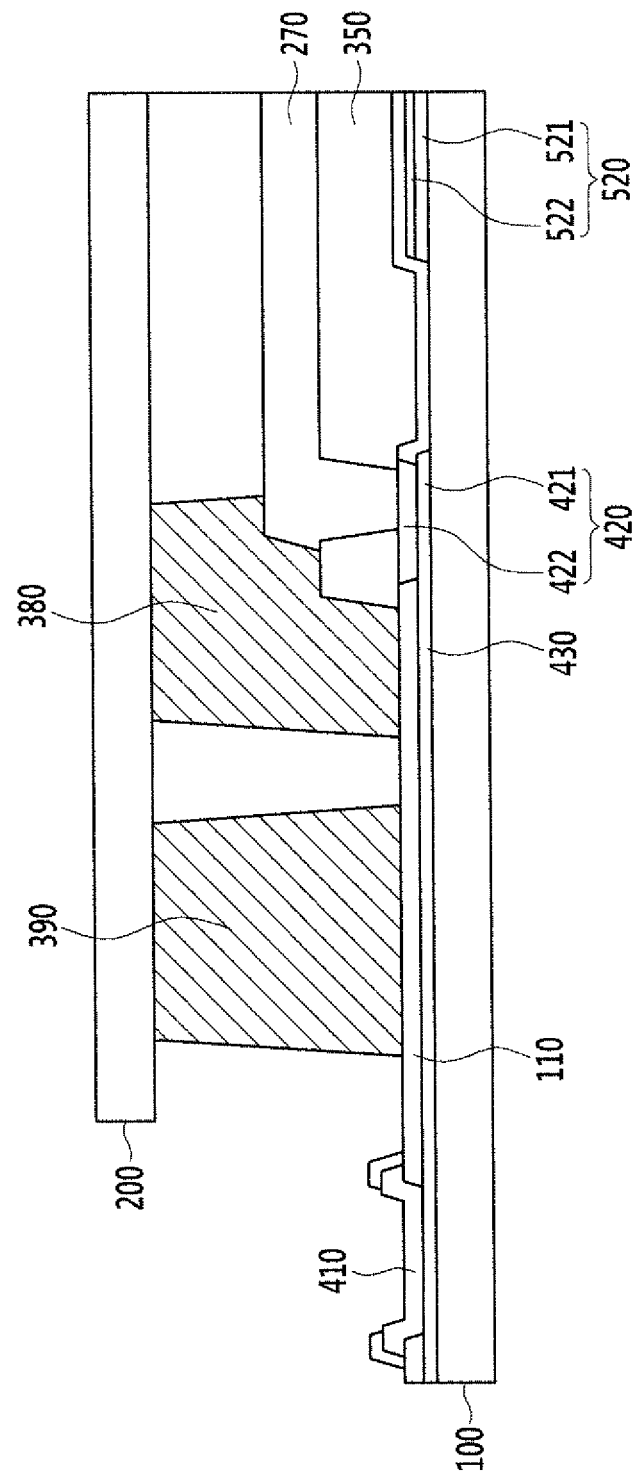
FIG. 5 is a cross-sectional view of the periphery portion of FIG. 4, taken along the line V-V.
Figure 6:
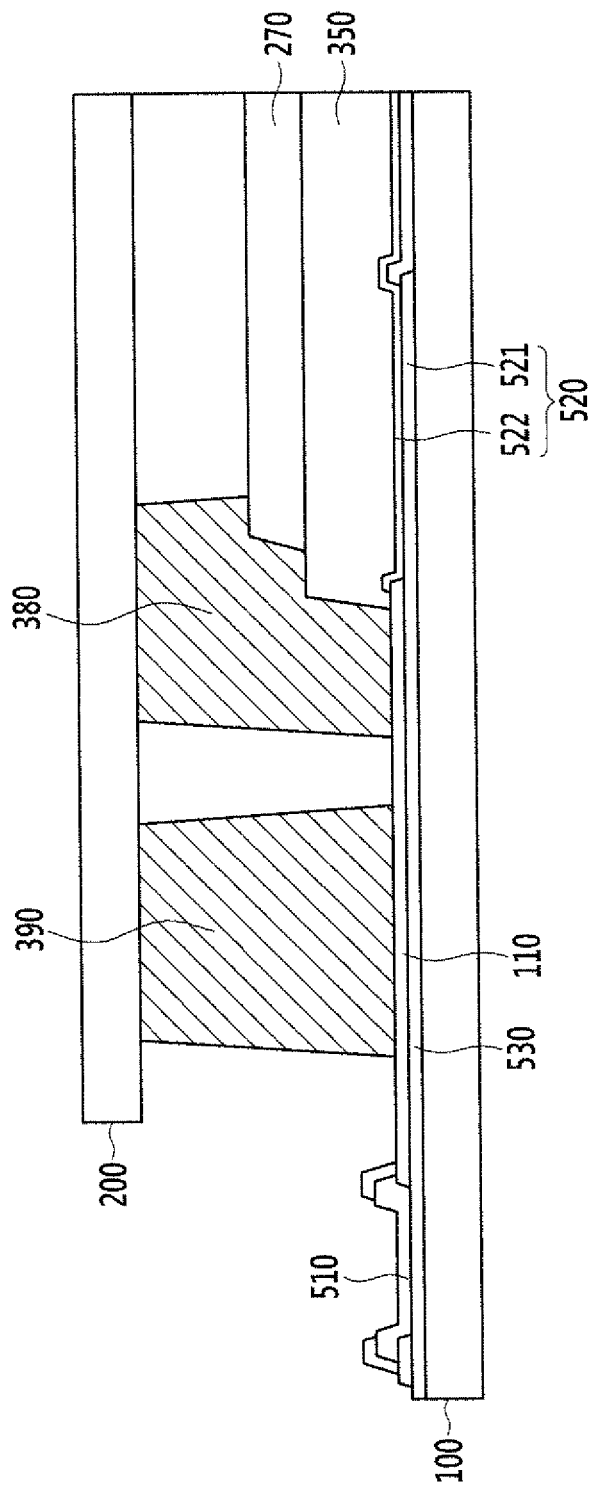
FIG. 6 is a cross-sectional view of the periphery portion of FIG. 4, taken along the line VI-VI.

FIG. 2 is a top plan view of a pixel portion and a periphery portion of the OLED display according to the first exemplary embodiment of the present invention, FIG. 3 is a cross-sectional view of the pixel portion of FIG. 2, taken along the line III-III, FIG. 4 is a cross-sectional view of the periphery portion of FIG. 4, taken along the line IV-IV, FIG. 5 is a cross-sectional view of the periphery portion of FIG. 4, taken along the line V-V, and FIG. 6 is a cross-sectional view of the periphery portion of FIG. 4, taken along the line VI-VI.

As shown in FIG. 2 and FIG. 3, the OLED display according to the first exemplary embodiment of the present invention includes a pixel portion P where a plurality of pixels 50, each formed of an organic light emitting diode LD, are disposed, a pixel substrate 100 including a periphery portion S surrounding the pixel portion P, and a sealing substrate 200 arranged opposite the pixel substrate 100 and covering the pixel substrate 100.

In the pixel portion P of the pixel substrate 100, the switching thin film transistor Qs (of FIG. 1), the driving thin film transistor Qd, the pixel electrode 191, the pixel defining layer 350, and the common electrode 270 are formed. In addition, a gate line 121 transmitting a gate signal (or a scan signal) to the switching thin film transistor Qs and the driving thin film transistor Qd, and a data line 171 transmitting a data signal to the switching thin film transistor Qs and the driving thin film transistor Qd, are formed in the pixel portion P.

The pixel electrode 191 is connected to the driving thin film transistor Qd, and may be formed of a transparent conductor such as ITO or IZO.

The pixel defining layer 350 formed of an organic layer is formed on the pixel electrode 191. The pixel defining layer 350 has an opening exposing the pixel electrode 191 by surrounding the periphery region of the pixel electrode 191.

An organic emission member 370 is formed on the pixel defining layer 350. The organic emission member 370 may include an organic emission layer emitting light and an auxiliary layer (not shown) for enhancing light emission efficiency of the light emission layer. The auxiliary layer may be one or more selected from an electron transport layer (ETL), a hole transport layer (HTL), an electron injection layer (EIL), and a hole injection layer (HIL).

A common electrode 270 is formed on the organic emission member 370. The common electrode 270 may be formed of metal having high reflectivity. The common electrode 270 is formed in a front surface of the substrate 100, and flows a current to the organic emission member 370 by forming pair with the pixel electrode 191.

The pixel electrode 191, the organic emission member 370, and the common electrode 270 form the organic light emitting diode LD of FIG. 1. The pixel electrode 191 may be a cathode and the common electrode 270 may be a cathode, or the pixel electrode 191 may be a cathode and the common electrode 270 may be an anode.

As shown in FIG. 2 to FIG. 6, a plurality of common voltage lines 400 applying a common voltage to the common electrode 270 and a plurality of driving voltage lines 500 applying a driving voltage to the pixel electrode 191 are formed in the periphery portion S. The plurality of driving voltage lines 500 surround a side surface of the plurality of common voltage lines 400. In this case, the plurality of common voltage lines 400 are separated from each other.

The common voltage lines 400 include a plurality of common voltage pads 410 to which the common voltage from an external source is applied, a common voltage contact portion 420 overlapping an end of the common electrode 270 and contacting the common electrode 270, and a common voltage connection portion 430 connecting the common voltage pad 410 and the common voltage contact portion 420.

The common voltage contact portion 420 includes a gate common voltage contact portion 421 formed in the same layer where the gate line 121 is formed and extending from the common voltage connection portion 430, and a data common voltage contact portion 422 formed in the same layer where the data line 171 is formed and contacting the common electrode 270.

In the common voltage contact portion 420, an end of the gate common voltage contact portion 421 and an end of the data common voltage contact portion 422 include common oblique portions 421a and 422a, respectively. Each of the common oblique portions 421a and 422a is formed oblique to an imaginary line L that is disposed in parallel with an end of the pixel substrate 100 when viewed from a top plan view.

In this case, referring to FIG. 4, a width d2 of the common voltage contact portion 420 is larger than a width d1 of the common voltage connection portion 430, and therefore the common voltage contact portion 420 has a side protrusion portion 420a (see FIG. 2) protruding toward one side thereof.

Thus, a contact area of the common voltage contact portion 420 of the common voltage lines 400 is maximized to solve heat generation by minimizing a voltage drop (IR DROP).

In addition, the driving voltage line 500 includes a plurality of driving voltage pads 510 to which a driving voltage from an external source is applied, a driving voltage overlapping portion 520 overlapped with the common voltage 270, and a driving voltage connection portion 530 connecting the driving voltage pad 510 to the driving voltage overlapping portion 520.

The driving voltage overlapping portion 520 includes a gate driving voltage overlapping portion 521 formed in the same layer where the gate line 121 is formed and extending from the driving voltage connection portion 530, and a driving voltage overlapping portion 522 formed in the same layer where the data line 171 is formed and overlapping the gate driving voltage overlapping portion 521.

An end of the driving voltage overlapping portion 520 includes a driving oblique portion 52 facing the common oblique line 42 of the common voltage contact portion 420 (see FIG. 2). The driving oblique line 52 is disposed between the common oblique portion 42 and the pixel portion P. A width I2 of an oblique line inflow portion 52b in which the driving voltage is taken is larger than a width I1 of an oblique line outlet portion 52a through which the driving voltage is discharged.

The width I1 (see FIG. 4) of the oblique line outlet portion 52a having a lower current density than the oblique line inflow portion 52b is set small, and an area formed by reducing the width of the oblique line outlet portion 52a is utilized as an area of the common oblique line 42, to thereby reduce a dead space.

Furthermore, the gate driving voltage overlapping portion 521 of the driving voltage overlapping portion 520 mostly overlaps the data driving voltage overlapping portion 522 so that a voltage drop (IRDROP) between the gate driving voltage overlapping portion 521 and the data driving voltage overlapping portion 522 can be minimized.

A layered structure of the periphery portion of the OLED display according to the first exemplary embodiment of the present invention will be described in further detail with reference to FIG. 5 and FIG. 6.

In FIG. 5 and FIG. 6, the common voltage connection portion 430 and the driving voltage connection portion 530 are formed with the same material as the gate line 121 on the same layer where the gate line 121 is formed on the periphery portion S of the pixel substrate 100. The common voltage connection portion 430 forms a gate common voltage contact portion 421 by being extended, and the driving voltage connection portion 530 forms a gate driving voltage overlapping portion 521 by being extended.

A gate insulation layer 110 is formed on the common voltage connection portion 430, the gate common voltage contact portion 421, the driving voltage connection portion 530, and the gate driving voltage overlapping portion 521. The gate insulation layer 110 includes openings respectively exposing the common voltage connection portion 430, the gate common voltage contact portion 421, the driving voltage connection portion 530, and the gate driving voltage overlapping portion 521. A data common voltage contact portion 422 and a data driving voltage overlapping portion 522, formed of the same material as the data line 171, are formed in the opening exposing the gate common voltage contact portion 421 and the gate driving voltage overlapping portion 521, respectively.

In addition, a common voltage pad 410 and a driving voltage pad 510 are formed in the opening exposing an end of the common voltage connection portion 430 and an end of the driving voltage connection portion 530, respectively. The common voltage pad 410 directly contacts the common voltage connection portion 430, and the driving voltage pad 510 directly contacts the driving voltage connection portion 530.

A pixel defining layer 350 extended to the periphery portion S is formed on the data common voltage contact portion 422 and the data driving voltage overlapping portion 522. The pixel defining layer 350 has an opening exposing the data common voltage contact portion 422, and the data common voltage contact portion 422 contacts the end of the common electrode 270 through the opening.

A moisture absorption agent 380 is formed to absorb moisture between the periphery portion S of the pixel substrate 100 and the sealing substrate 200. The moisture absorption agent 380 is formed on the pixel defining layer 350 while being partially overlapped with the pixel defining layer 350. A part of the moisture absorption agent 380 contacts the pixel substrate 100.

A sealing member 390 is formed between the pixel substrate 100 and the sealing substrate 200 so as to seal the space therebetween. The sealing member 390 is formed on the outer side of the moisture absorption agent 380 and surrounds the moisture absorption agent 380.

Figure 7:
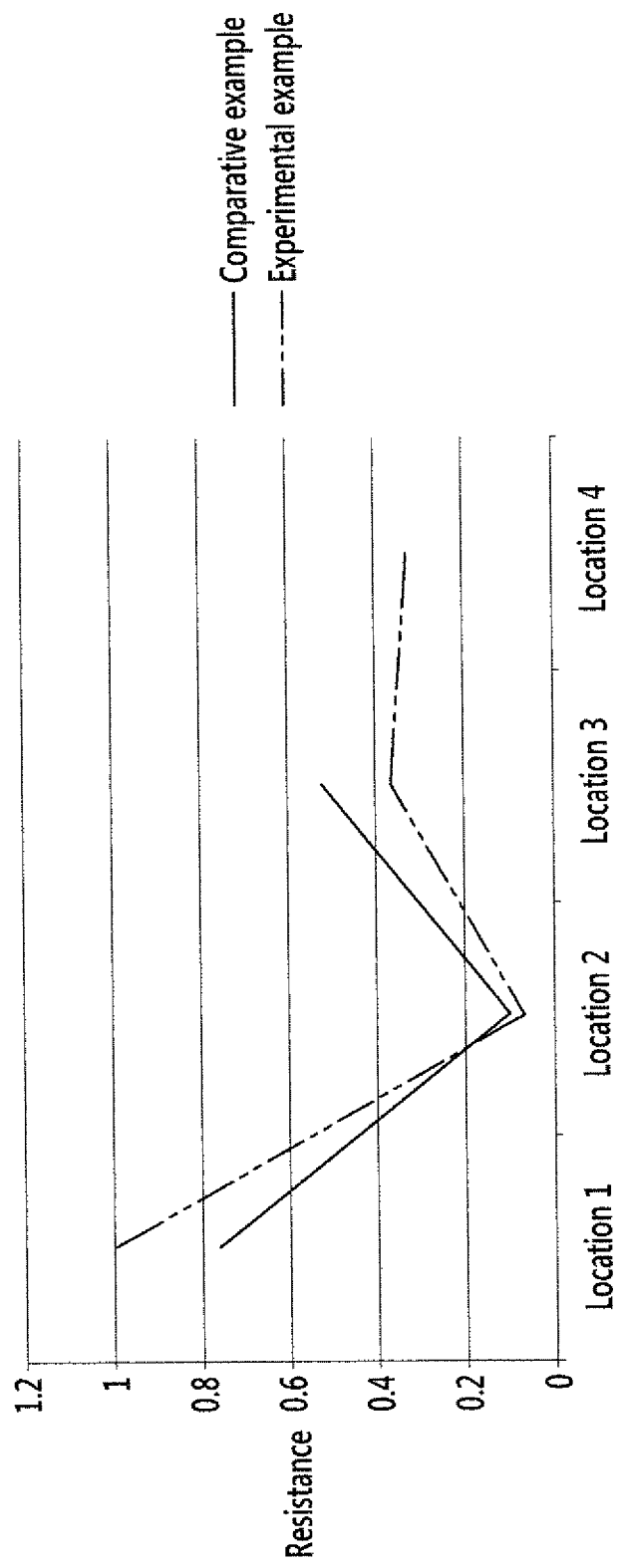
FIG. 7 is a graph illustrating resistance values of the OLED display of the first exemplary embodiment of the present invention and several positions of a comparative example.
Figure 8:
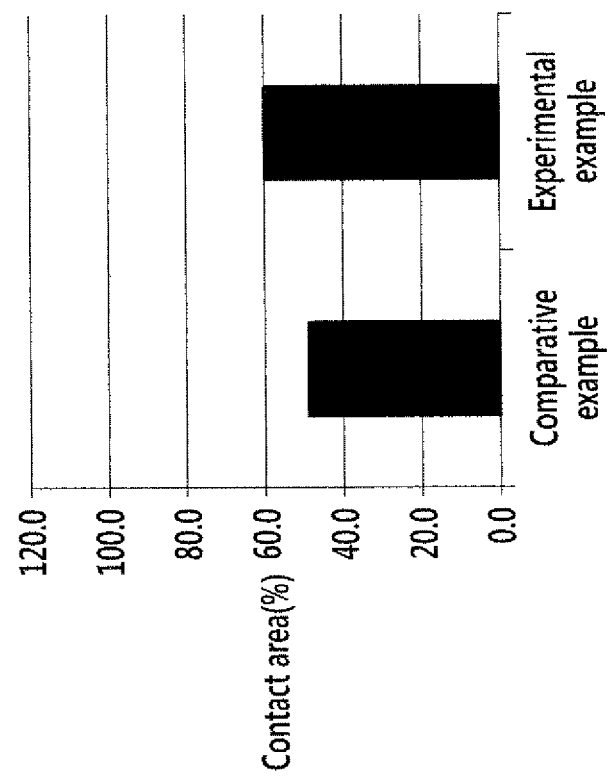
FIG. 8 is a graph illustrating contact areas of common electrode contact portions of the OLED display of the first exemplary embodiment of the present invention and the comparative example.

FIG. 7 is a graph showing resistance values at various positions of the OLED display according to the first exemplary embodiment of the present invention (designated the "Experimental example") and a Comparative example, and FIG. 8 is a graph illustrating a contact area of the common electrode contact portion of the OLED display according to the first exemplary embodiment of the present invention (designated the "Experimental example") and a common electrode contact portion of the Comparative example.

In FIG. 7, location 1 to location 4 sequentially indicate the furthest distance from the common voltage pad or the driving voltage pad, and the Comparative example is a case wherein a dead space of an OLED display having a five-mask structure is unilaterally reduced.

As shown in FIG. 7, the dead space was reduced but the resistance value was increased at location 3 according to the Comparative example. However, the dead space was reduced and the resistance was decreased according to the present exemplary embodiment (the "Experimental example").

In addition, as shown in FIG. 8, the comparative example had a contact area of about 50%, but the contact area of the present exemplary embodiment (the "Experimental example") was increased to about 60%. Thus, the dead space can be increased and the contact area of the common electrode contact portion is increased so that the voltage drop can be prevented according to the present exemplary embodiment.

Meanwhile, in the first exemplary embodiment, the driving voltage line 500 (FIG. 2) surrounds the side surface of the common voltage lines 400, but the common voltage line may surround the side surface of the driving voltage line according to a second exemplary embodiment.

Figure 9:
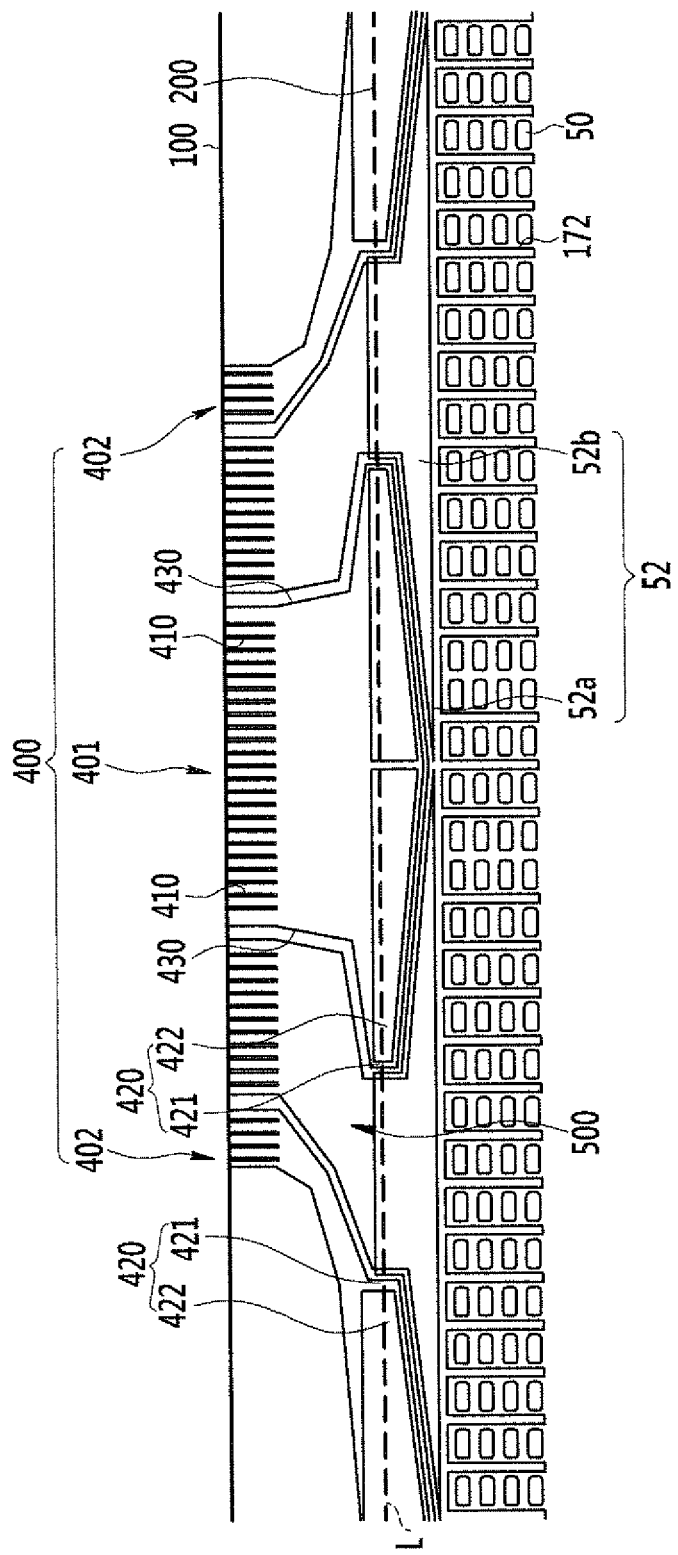
FIG. 9 is a top plan view of an OLED display according to a second exemplary embodiment of the present invention.

FIG. 9 is a top plan view of an OLED display according to a second exemplary embodiment of the present invention.

The exemplary embodiment shown in FIG. 9 is substantially the same as the first exemplary embodiment shown in FIG. 2 and FIG. 4 to FIG. 6 except for the fact that the common voltage line 400 surrounds the side surface of the driving voltage line 500. Therefore, a repeated description will be omitted.

As shown in FIG. 9, a plurality of common voltage lines 400 include a main common voltage line 401 and an auxiliary common voltage line 402 having a width that is smaller than that of the main common voltage line 401.

A driving voltage line 500 surrounds the side surface of the main common voltage line 401, and the auxiliary common voltage line 402 surrounds the side surface of the driving voltage line 500. In this case, the main common voltage line 401 is connected rather being separated.

As described, a contact area of a common voltage contact portion 420 of the common voltage line 400 can be maximized by forming the auxiliary common voltage line 402.

Meanwhile, the voltage drop of the driving voltage line 500 is minimized and the contact area of the common voltage contact portion 420 is increased by forming the driving oblique line 52 and the common oblique portion 42 according to the first exemplary embodiment, but the voltage drop of the driving voltage line 50 can be minimized and the contact area of the common voltage contact portion 420 can be maximized by disposing the auxiliary driving voltage line 502 between the common voltage lines 400 according to a third exemplary embodiment of the present invention. Hereinafter, the third exemplary embodiment of the present invention will be described in further detail with reference to FIG. 10.

Figure 10:
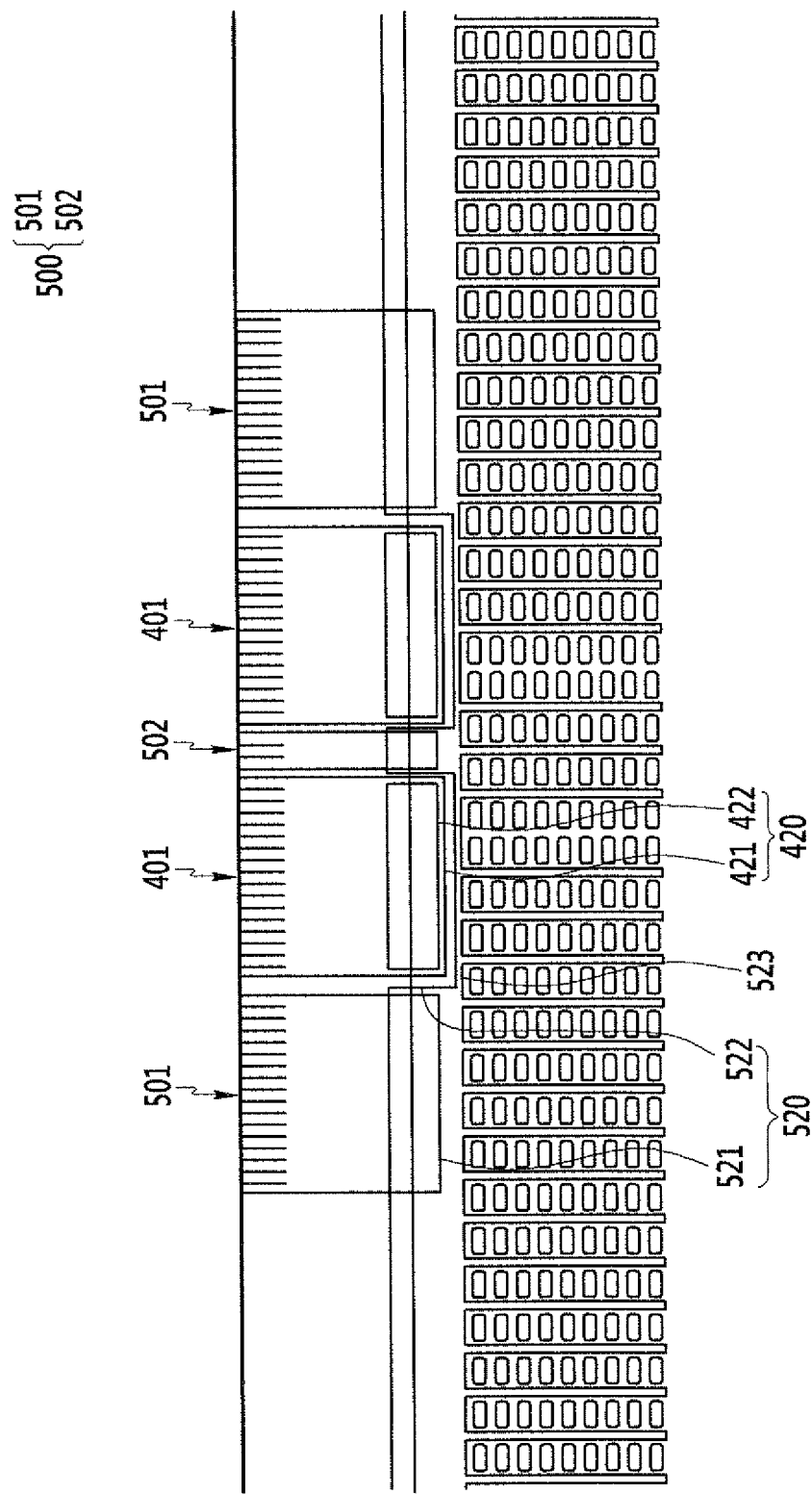
FIG. 10 is a top plan view of an OLED display according to a third exemplary embodiment of the present invention.

FIG. 10 is a top plan view of an OLED display according to the third exemplary embodiment of the present invention.

The third exemplary embodiment shown in FIG. 10 is substantially the same as the first exemplary embodiment shown in FIG. 2 and FIG. 4 to FIG. 6 except for the fact that a driving voltage line 500 is disposed between common voltage lines 400, and a driving oblique line portion and a common oblique line portion are not formed. Therefore, the repeated description will be omitted.

As shown in FIG. 10, a driving voltage line 500 includes a plurality of main driving voltage lines 501 and a plurality of auxiliary driving voltage lines 502, each of the driving voltage lines 502 having a width that is smaller than a width of each of the main driving voltage lines 501.

The auxiliary driving voltage line 502 is formed between main common voltage lines 401. A driving voltage overlapping portion of the driving voltage line 501 includes a driving extension portion 523 facing a common voltage contact portion 420. In addition, the driving extension portion 523 of the main driving voltage line 501 is connected to a driving voltage overlapping portion 520 of the auxiliary driving voltage line 502.

As described, a driving voltage can be directly transmitted to a pixel disposed under the main common voltage line 401 using the auxiliary driving voltage line 502 and the driving extension portion 523 formed between the main common voltage lines 401, and therefore a voltage drop can be minimized.

The driving voltage line 500 surrounds the side surface of the common voltage line 400 in the first exemplary embodiment, but the driving voltage line may be disposed between the common voltage lines according to a fourth exemplary embodiment.

Figure 11:
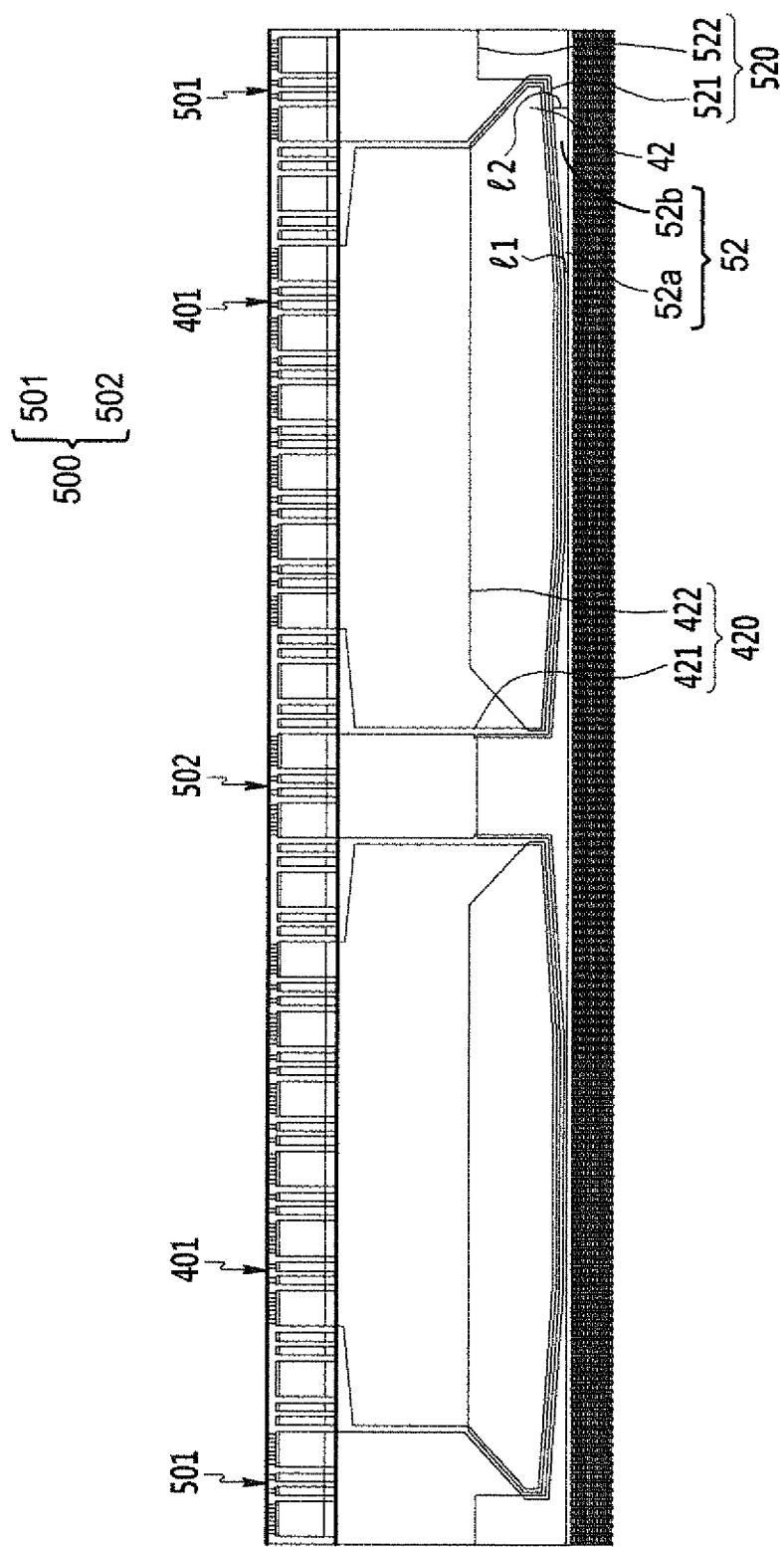
FIG. 11 is a top plan view of an OLED display according to a fourth exemplary embodiment of the present invention.
Figure 12:
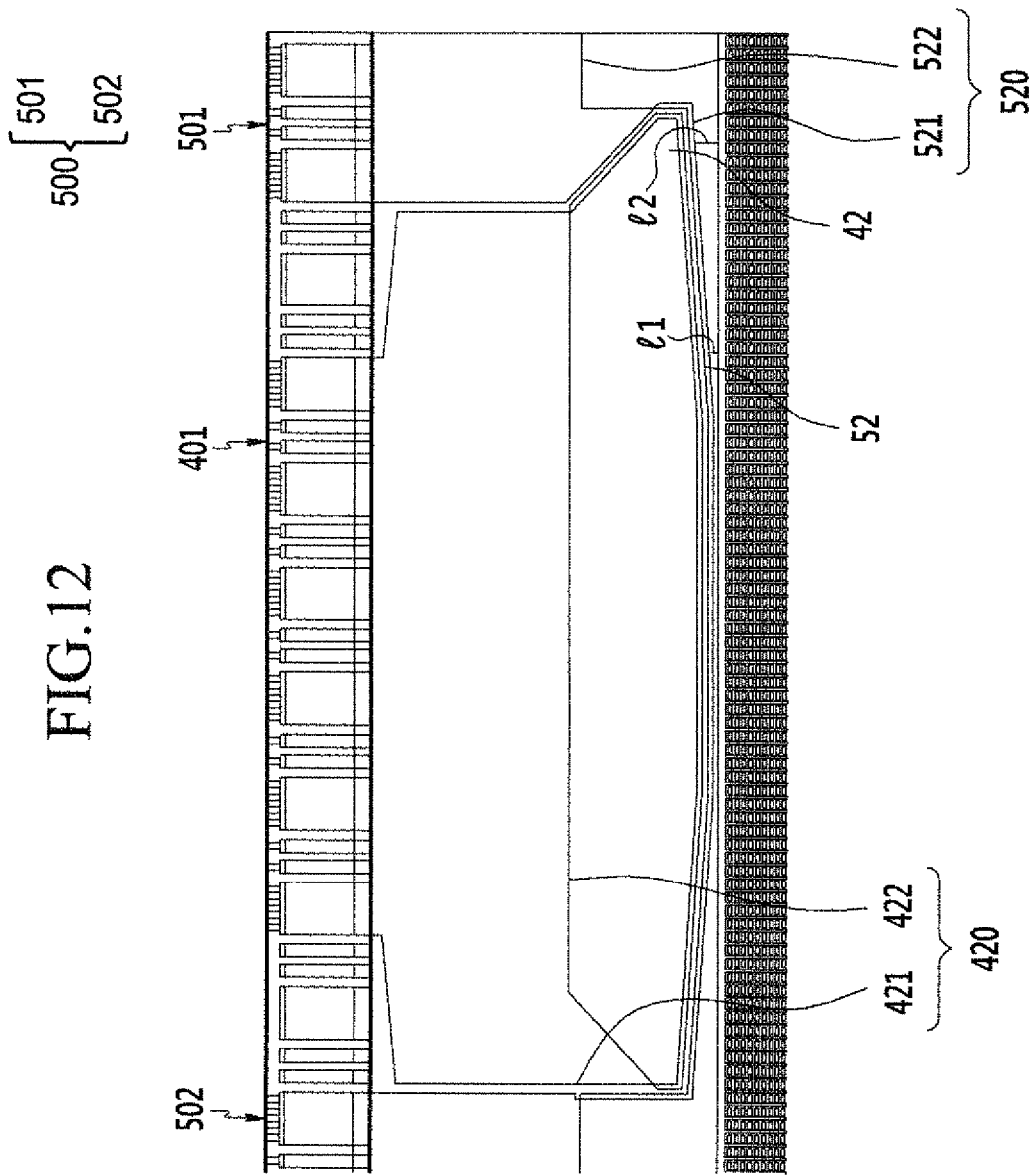
FIG. 12 is a partially enlarged top plan view of FIG. 11.

FIG. 11 is a top plan view of an OLED display according to a fourth exemplary embodiment of the present invention, and FIG. 12 is a partially enlarged top plan view of FIG. 11.

The fourth exemplary embodiment shown in FIG. 11 and FIG. 12 is substantially the same as the first exemplary embodiment shown in FIG. 2 and FIG. 4 to FIG. 6 except for the fact that a driving voltage line is disposed between common voltage lines. Therefore, the repeated description will be omitted.

As shown in FIG. 11 and FIG. 12, a plurality of driving voltage lines 500 include a plurality of auxiliary driving voltage lines 502, each having a width that is smaller than that of each of the main driving voltage lines 501. The main driving voltage lines 501 and the auxiliary driving voltage lines 502 are respectively connected to each other. In addition, the auxiliary driving voltage line 502 is formed between main common voltage lines 401.

As described, a driving voltage can be directly transmitted to a pixel disposed under the main common voltage line 401 using the auxiliary driving voltage line 502 formed between the main common voltage lines 401, and therefore a voltage drop can be minimized.

Furthermore, an end of a driving voltage overlapping portion 520 includes a driving oblique line portion 52 facing a common oblique line portion 42 of a common voltage contact portion 420. The driving oblique line portion 52 is provided between the common oblique line portion 42 and a pixel portion. Among the driving oblique line portions 52, a width l2 of an oblique line inflow portion 52b in which a driving voltage is taken is larger than a width l1 of an oblique line outlet portion 52a through which the driving voltage is discharged.

The width l1 of the oblique line outlet portion 52a having a lower current density than the oblique line inflow portion 52b is set small, and an area formed by reducing the width of the oblique line outlet portion 52a is utilized as an area of the common oblique line portion 42, to thereby reduce a dead space.

Furthermore a gate driving voltage overlapping portion 521 of a driving voltage overlapping portion 520 mostly overlaps with a data driving voltage overlapping portion 522, and a voltage drop (IR drop) between a gate driving voltage overlapping portion 521 and a data driving voltage overlapping portion 522 can be minimized.

In the third exemplary embodiment, the auxiliary driving voltage line 502 is disposed between the common voltage lines 400, but a plurality of sub-auxiliary driving voltage lines may be disposed between a plurality of sub-common voltage lines according to a fifth exemplary embodiment.

FIG. 13 is a top plan view of an OLED display according to a fifth exemplary embodiment of the present invention.

The fifth exemplary embodiment shown in FIG. 13 is substantially the same as the third exemplary embodiment shown in FIG. 10 except for the fact that a plurality of sub-auxiliary driving voltage lines are disposed between a plurality of sub-common voltage lines. Therefore, the repeated description will be omitted.

As shown in FIG. 13, a plurality of driving voltage lines 500 include a main driving voltage line 501 and auxiliary driving voltage lines 502 having a width that is smaller than that of the main driving voltage line 501. A main common voltage line 401 includes a plurality of sub-common voltage lines 4011, 4012, 4013, and 4014.

The auxiliary driving voltage lines 502 includes a plurality of sub-auxiliary driving voltage lines 5021, 5022, 5023, and 5024, and the plurality of sub-common voltage lines 4011, 4012, 4013, and 4014 are disposed between the plurality of sub-auxiliary driving voltage lines 5021, 5022, 5023, and 5024.

The plurality of sub-auxiliary driving voltage lines 5021, 5022, 5023, and 5024 are connected to each other through a driving extension portion 523, and the plurality of sub-auxiliary driving voltage lines 5021, 5022, 5023, and 5024 and the main driving voltage line 501 are connected to each other through the driving extension portion 523.

As described, a driving voltage can be directly transmitted to a pixel disposed under sub-common voltage lines 4011, 4012, 4013, and 4014 using the plurality of sub-auxiliary driving voltage lines 5021, 5022, 5023, and 5024 and the driving extension portion 523, and accordingly a voltage drop can be minimized.

While this invention has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. An organic light emitting diode (OLED) display, comprising:
    a pixel portion including an organic light emitting diode which includes
        a pixel electrode,
        an organic emission layer, and
        a common electrode; and
    a periphery portion surrounding the pixel portion and having a plurality of common voltage lines applying a common voltage to the common electrode; the common voltage lines comprising:
        a plurality of common voltage pads to which the common voltage is applied from an external source;
        a common voltage contact portion overlapping an end of the common electrode and contacting the common electrode; and
        a common voltage connection portion connecting the common voltage pad to the common voltage contact portion; and
        a width of the common voltage contact portion being larger than a width of the common voltage connection portion and a width of one of the common voltage pads,
    the periphery portion further comprising:
        a plurality of driving voltage lines applying a driving voltage to the pixel electrode; and the driving voltage lines comprising;
        a plurality of driving voltage pads to which the driving voltage is applied from an external source;
        a driving voltage overlapping portion overlapping the common electrode; and
        a driving voltage connection portion connecting the driving voltage pad and the driving voltage overlapping portion;
        an end of the driving voltage overlapping portion including a driving oblique line portion facing a common oblique line portion of the common voltage contact portion,
        the driving oblique line portion including:
            an oblique line inflow portion through which the driving voltage is taken and
            an oblique line outlet portion through which the driving voltage is discharged,
            a width of the oblique line inflow portion being larger than an oblique line outlet portion.

2. An organic light emitting diode (OLED) display, comprising:
    a pixel portion including an organic light emitting diode that includes
        a pixel electrode,
        an organic emission layer, and
        a common electrode; and
    a periphery portion surrounding the pixel portion and having a plurality of common voltage lines applying a common voltage to the common electrode;
    the common voltage lines comprising:
        a plurality of common voltage pads to which the common voltage is applied from an external source;
        a common voltage contact portion overlapping an end of the common electrode and contacting the common electrode; and
        a common voltage connection portion connecting the common voltage pad and the common voltage contact portion,
        a width of the common voltage contact portion being larger than a width of the common voltage connection portion,
    the periphery portion further comprising a plurality of driving voltage lines applying a driving voltage to the pixel electrode,
    the driving voltage lines comprising:
        a plurality of driving voltage pads to which the driving voltage is applied from an external source;
        a driving voltage overlapping portion overlapping the common electrode; and
        a driving voltage connection portion connecting the driving voltage pad and the driving voltage overlapping portion;
        an end of the driving voltage overlapping portion including a driving oblique line portion facing a common oblique line portion of the common voltage contact portion; and
        the driving oblique line portion including:
            an oblique line inflow portion through which the driving voltage is taken, and
            an oblique line outlet portion through which the driving voltage is discharged,
            a width of the oblique line inflow portion being larger than an oblique line outlet portion.

3. An organic light emitting diode (OLED) display, comprising:
    a pixel portion including an organic light emitting diode that includes
        a pixel electrode,
        an organic emission layer, and
        a common electrode; and
    a periphery portion surrounding the pixel portion and having a plurality of common voltage lines applying a common voltage to the common electrode;
    the common voltage lines comprising:
        a plurality of common voltage pads to which the common voltage is applied from an external source;
        a common voltage contact portion overlapping an end of the common electrode and contacting the common electrode; and
        a common voltage connection portion connecting the common voltage pad and the common voltage contact portion;
    a width of the common voltage contact portion being larger than a width of the common voltage connection portion;
    the periphery portion further comprising a plurality of driving voltage lines applying a driving voltage to the pixel electrode;
    the driving voltage lines comprising:
        a plurality of driving voltage pads to which the driving voltage is applied from an external source;
        a driving voltage overlapping portion overlapping the common electrode; and a driving voltage connection portion connecting the driving voltage pad and the driving voltage overlapping portion, an end of the driving voltage overlapping portion including a driving oblique line portion facing a common oblique line portion of the common voltage contact portion, the driving voltage overlapping portion comprising:
  a gate driving voltage overlapping portion formed in the same layer where the gate line is formed and extending from the driving voltage connection portion, and
  a data driving voltage overlapping portion formed in a same layer where a data line is formed and overlapping the gate driving voltage overlapping portion.

4. The OLED display of claim 3, the common voltage contact portion comprising:
  a gate common voltage contact portion formed in the same layer where the gate line is formed and extending from the common voltage connection portion; and
  a data common voltage contact portion formed in the same layer where the data line is formed and contacting the common electrode.

5. The OLED display of claim 1, an end of the common voltage contact portion comprising a common oblique line portion.

6. The OLED display of claim 5, further comprising a pixel substrate on which the pixel portion and the periphery portion are formed, and
  the common oblique line portion being formed oblique to an imaginary line disposed in parallel with an end of the pixel substrate when viewed from a top plan view.

7. The OLED display of claim 1, the common voltage contact portion comprising a protrusion portion protruding toward a side of the common voltage contact portion.

8. The OLED display of claim 1, the driving oblique line portion being disposed between the common oblique line portion and the pixel portion.

9. The OLED display of claim 1, the common voltage connection portion and the driving voltage connection portion being formed in a same layer where a gate line is formed.

10. The OLED display of claim 9, the driving voltage overlapping portion comprising:
  a gate driving voltage overlapping portion formed in the same layer where the gate line is formed and extending from the driving voltage connection portion, and
  a data driving voltage overlapping portion formed in a same layer where a data line is formed and overlapping the gate driving voltage overlapping portion.

11. The OLED display of claim 10, the common voltage contact portion comprising:
  a gate common voltage contact portion formed in the same layer where the gate line is formed and extending from the common voltage connection portion, and
  a data common voltage contact portion formed in the same layer where the data line is formed and contacting the common electrode.

12. The OLED display of claim 1, the plurality of common voltage lines comprising a plurality of main common voltage lines and a plurality of auxiliary common voltage lines,
  each of the auxiliary common voltage lines having a width that is smaller than a width of each of the main common voltage lines.

13. The OLED display of claim 12, the plurality of driving voltage lines comprising a plurality of main driving voltage lines and a plurality of auxiliary driving voltage lines,
  each of the auxiliary driving voltage lines having a width that is smaller than a width of each of the main driving voltage lines.

14. The OLED display of claim 13, the main driving voltage lines surrounding a side surface of the main common voltage lines.

15. The OLED display of claim 13, the auxiliary common voltage lines surrounding a side surface of the main driving voltage lines.

16. The OLED display of claim 13, the plurality of main common voltage lines being connected to each other.

17. The OLED display of claim 13, the plurality of main common voltage lines being separated from each other.

18. The OLED display of claim 17, the auxiliary driving voltage lines being formed between the plurality of main common voltage lines.

* * * * *